(12) United States Patent
Sakagami

(10) Patent No.: US 8,043,930 B2
(45) Date of Patent: Oct. 25, 2011

(54) SEMICONDUCTOR MEMORY DEVICE AND METHOD OF MANUFACTURING THE SAME

(75) Inventor: Eiji Sakagami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 269 days.

(21) Appl. No.: 12/354,908

(22) Filed: Jan. 16, 2009

(65) Prior Publication Data

US 2009/0130809 A1    May 21, 2009

Related U.S. Application Data

(63) Continuation of application No. 11/552,705, filed on Oct. 25, 2006, now abandoned.

(30) Foreign Application Priority Data

Nov. 7, 2005   (JP) .................................. 2005-322100

(51) Int. Cl.
   *H01L 21/76* (2006.01)
(52) U.S. Cl. ........................................ 438/414; 438/218
(58) Field of Classification Search ........................ None
    See application file for complete search history.

(56) References Cited

U.S. PATENT DOCUMENTS

| | | |
|---|---|---|
| 6,518,642 B2 | 2/2003 | Kim et al. |
| 6,642,105 B2 | 11/2003 | Kim et al. |
| 2005/0012142 A1 | 1/2005 | Hazama et al. |
| 2005/0090052 A1 * | 4/2005 | Matsui et al. ............... 438/222 |
| 2005/0093047 A1 | 5/2005 | Goda et al. |
| 2005/0127473 A1 | 6/2005 | Sakagami |

FOREIGN PATENT DOCUMENTS

| | | |
|---|---|---|
| JP | 2002-176114 | 6/2002 |
| JP | 2002-368077 | 12/2002 |
| JP | 2003-37251 | 2/2003 |
| JP | 2004-14970 | 1/2004 |
| JP | 2004-363443 | 12/2004 |
| JP | 2005-142340 | 6/2005 |

OTHER PUBLICATIONS

Office Action issued Nov. 30, 2010, in Japan Patent Application No. 2005-322100 (with English translation).

* cited by examiner

*Primary Examiner* — Zandra Smith
*Assistant Examiner* — Pamela E Perkins
(74) *Attorney, Agent, or Firm* — Oblon, Spivak, McClelland, Maier & Neustadt, L.L.P.

(57) ABSTRACT

A semiconductor memory device includes first and second element isolation insulating films, first and second gate insulating films, first and second gate wiring and first and second mask layer. First and second upper surfaces of the first and second element isolation insulating films are higher than an upper surface of the substrate, first and second bottom surfaces of the first and second element isolation insulating films are lower than the upper surface of the substrate, a second height from the upper surface of the substrate to the second upper surface is larger than a first height from the upper surface of the substrate to the first upper surface. A height from the upper surface of the substrate to an upper surface of the first mask layer equals a height from the upper surface of the substrate to an upper surface of the second mask layer.

8 Claims, 13 Drawing Sheets

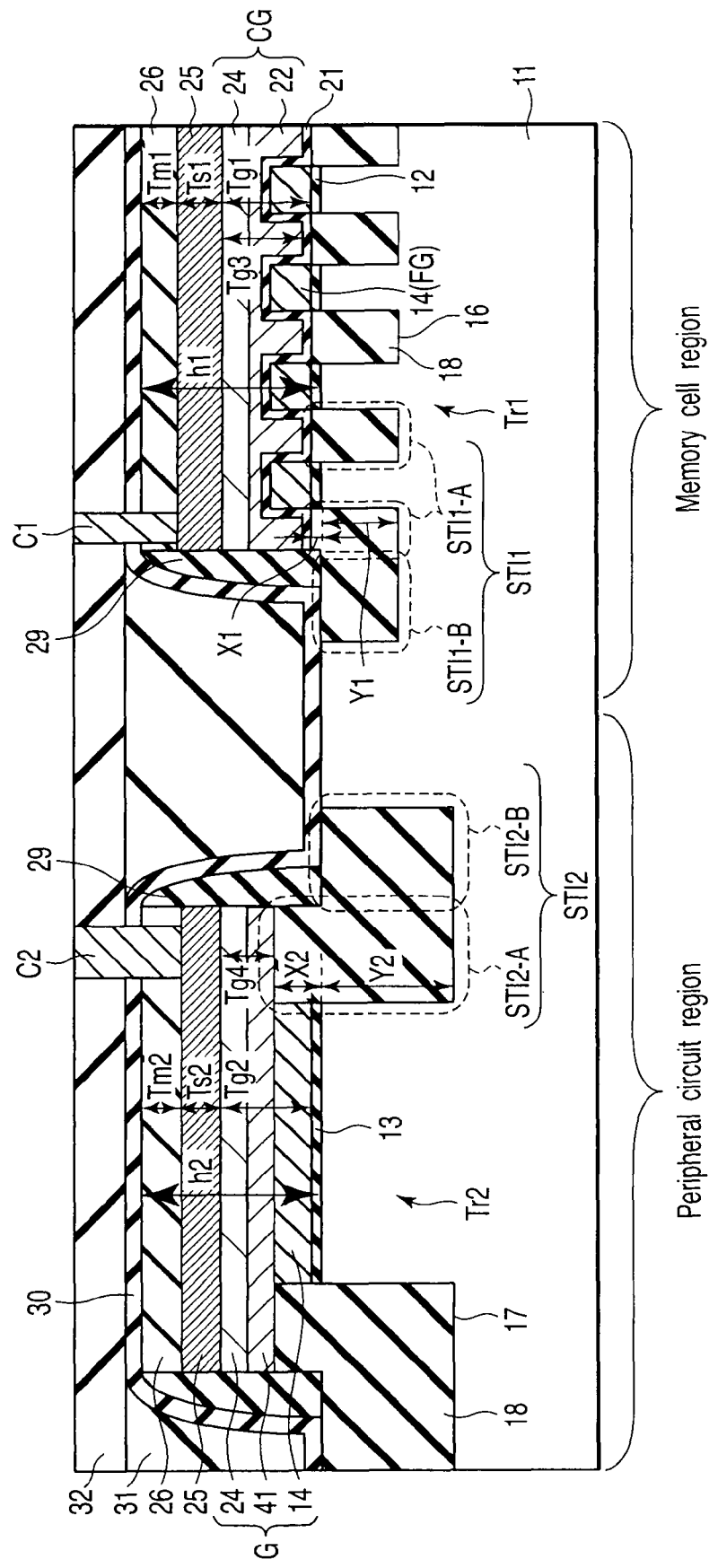
F I G. 12

SEMICONDUCTOR MEMORY DEVICE AND METHOD OF MANUFACTURING THE SAME

CROSS-REFERENCE TO RELATED APPLICATIONS

This application is a continuation of and claims the benefit of priority under 35 U.S.C. §120 from U.S. Ser. No. 11/552,705 filed Oct. 25, 2006, and claims the benefit of priority under 35 U.S.C. §119 from Japanese Patent Application No. 2005-322100 filed Nov. 7, 2005, the entire contents of each of which are incorporated herein by reference.

BACKGROUND OF THE INVENTION

1. Field of the Invention

The present invention relates to a nonvolatile semiconductor memory device having a layered gate structure with a shallow trench isolation (STI) element isolation insulating film and a method of manufacturing the same.

2. Description of the Related Art

Along with the recent size reduction of semiconductor memory devices, element isolation by self-aligned shallow trench isolation (STI) is becoming popular. In element isolation using STI, the width of STI in the memory cell region is minimized, and the STI is made shallow to minimize the aspect ratio in gap filling so as to ensure the STI gap filling capability. In the peripheral circuit portion to control the memory cell, however, the dielectric isolation between elements is more necessary than memory cells. To ensure the dielectric isolation, the STI in the peripheral circuit region is deeper than the STI in the memory cell region (see e.g., Jpn. Pat. Appln. KOKAI Publication No. 2002-368077).

However, if the dielectric isolation in the peripheral circuit region is to be further improved, the STI cannot be deepened because of the restrictions on the STI gap filling capability. Instead, in the peripheral circuit region, the STI is made higher than in the memory cell region. In this case, however, the following problems are posed.

The STI is high in the peripheral circuit region and low in the memory cell region. For this reason, the height from the surface of the silicon substrate to the mask material of the gate wiring is large in the peripheral circuit region and small in the memory cell region. If the gate wiring is to be buried by an insulating film, and planarization by chemical mechanical polishing (CMP) is to be executed, a barrier layer deposited on the mask material of the gate wiring is used as the stopper of CMP. However, since the height to the mask material changes between the memory cell region and the peripheral circuit region, the barrier layer in the peripheral circuit region where the mask material is high is excessively polished by CMP. For this reason, the barrier layer on the peripheral circuit region side becomes thin at the boundary between the memory cell region and the peripheral circuit region, or the barrier layer is completely lost. In addition, the difference in height to the barrier layer between the peripheral circuit region and the memory cell region (the step difference between the memory cell region and the peripheral circuit region) influences metal interconnection formation to be performed later. Hence, a resolution failure occurs in lithography at the step portion of the boundary region.

BRIEF SUMMARY OF THE INVENTION

According to a first aspect of the present invention, there is provided a semiconductor memory device comprising a semiconductor substrate which has a first region and a second region, a first element isolation insulating film which is formed in the semiconductor substrate in the first region, includes a first upper surface higher than an upper surface of the semiconductor substrate and a first bottom surface lower than the upper surface of the semiconductor substrate, and has a first height from the upper surface of the semiconductor substrate to the first upper surface, a second element isolation insulating film which is formed in the semiconductor substrate in the second region, includes a second upper surface higher than the upper surface of the semiconductor substrate and a second bottom surface lower than the upper surface of the semiconductor substrate, and has a second height from the upper surface of the semiconductor substrate to the second upper surface, the second height being larger than the first height, a first gate insulating film which is formed on the semiconductor substrate in the first region, a first gate wiring which is formed on the first gate insulating film, a first mask layer which is formed on the first gate wiring, a second gate insulating film which is formed on the semiconductor substrate in the second region, a second gate wiring which is formed on the second gate insulating film, and a second mask layer which is formed on the second gate wiring, wherein a height from the upper surface of the semiconductor substrate to an upper surface of the first mask layer equals a height from the upper surface of the semiconductor substrate to an upper surface of the second mask layer.

According to a second aspect of the present invention, there is provided a semiconductor memory device manufacturing method comprising, in a semiconductor substrate having a first region and a second region, forming a first gate insulating film on the semiconductor substrate in the first region and forming a second gate insulating film on the semiconductor substrate in the second region, forming a first gate wiring material on the first gate insulating film and the second gate insulating film, forming a first element isolation insulating film by partially removing the first gate wiring material, the first gate insulating film, and the semiconductor substrate and forming a second element isolation insulating film by partially removing the first gate wiring material, the second gate insulating film, and the semiconductor substrate, making a first height from an upper surface of the semiconductor substrate to an upper surface of the first element isolation insulating film smaller than a second height from the upper surface of the semiconductor substrate to an upper surface of the second element isolation insulating film by removing an upper portion of the first element isolation insulating film, forming a second gate wiring material, third gate wiring material, and first mask layer sequentially in the first region and forming a fourth gate wiring material and a second mask layer sequentially in the second region, and removing an upper portion of the first mask layer to make a height from the upper surface of the semiconductor substrate to an upper surface of the first mask layer equal to a height from the upper surface of the semiconductor substrate to an upper surface of the second mask layer.

According to a third aspect of the present invention, there is provided a semiconductor memory device manufacturing method comprising, in a semiconductor substrate having a first region and a second region, forming a first gate insulating film on the semiconductor substrate in the first region and forming a second gate insulating film on the semiconductor substrate in the second region, forming a first gate wiring material on the first gate insulating film and the second gate insulating film, forming a first element isolation insulating film by partially removing the first gate wiring material, the first gate insulating film, and the semiconductor substrate and forming a second element isolation insulating film by partially removing the first gate wiring material, the second gate insulating film, and the semiconductor substrate, making a first height from an upper surface of the semiconductor substrate to an upper surface of the first element isolation insulating film smaller than a second height from the upper surface of the semiconductor substrate to an upper surface of the second element isolation insulating film by removing an upper portion of the first element isolation insulating film, forming a second gate wiring material in the first region, forming a third gate wiring material in the second region, and making upper surfaces of the second gate wiring material and the third gate wiring material flush with each other, and forming a first mask layer on the second gate wiring material and forming a second mask layer on the third gate wiring material.

BRIEF DESCRIPTION OF THE SEVERAL VIEWS OF THE DRAWING

FIG. 12 is a sectional view showing a semiconductor memory device having a memory cell region and peripheral circuit region according to the second embodiment of the present invention;

DETAILED DESCRIPTION OF THE INVENTION

Figure 1:
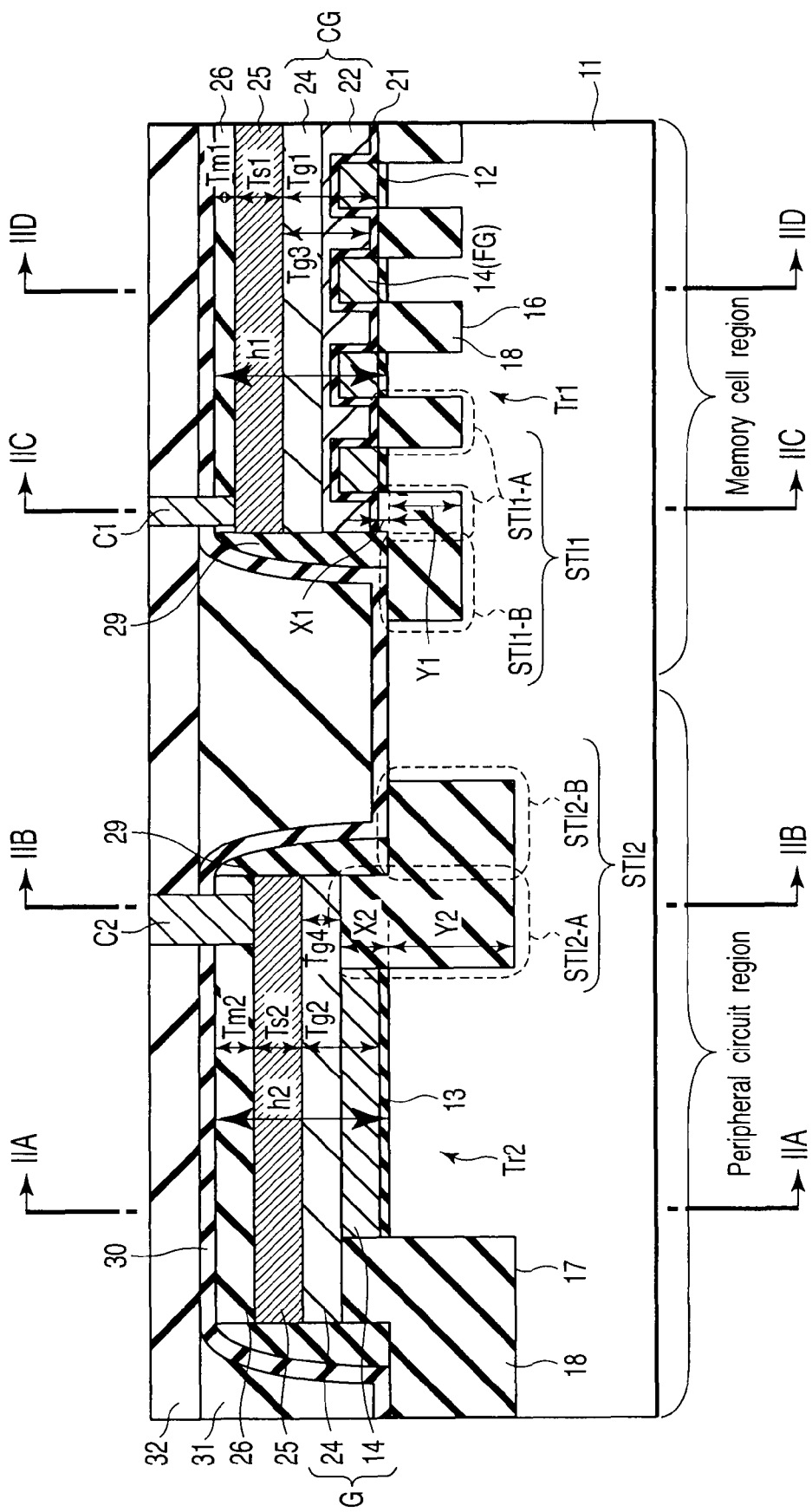
FIG. 1 is a sectional view showing a semiconductor memory device having a memory cell region and peripheral circuit region according to the first embodiment of the present invention.

The embodiments of the present invention will be described below with reference to the accompanying drawing. The same reference numerals denote the same parts throughout the drawing.

First Embodiment

A nonvolatile semiconductor memory according to the first embodiment has two kinds of self-aligned shallow trench isolation (STI) element isolation insulating films (element isolation regions) which are shallow in a memory cell region and deep in a peripheral circuit region. The height of STI under the gate wiring in the peripheral circuit region is larger than that of STI under the gate wiring in the memory cell region. The height from the upper surface of a semiconductor substrate to the mask layer of the gate wiring is equal in the memory cell region and peripheral circuit region.

Figure 2A:
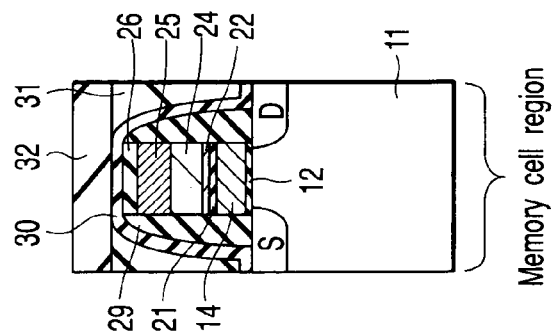
FIG. 2A is a sectional view showing the semiconductor memory device in the peripheral circuit region taken along a line IIA-IIA in FIG. 1.
Figure 2B:
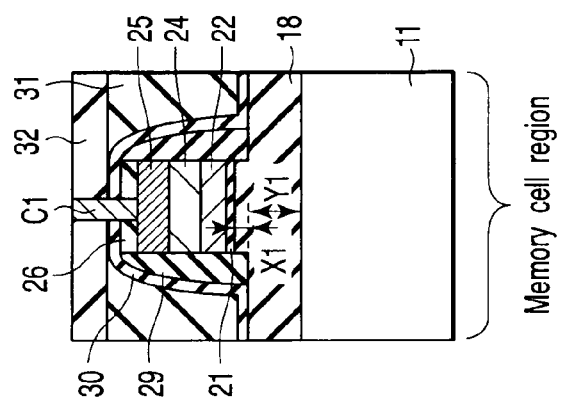
FIG. 2B is a sectional view showing the semiconductor memory device in the peripheral circuit region taken along a line IIB-IIB in FIG. 1.
Figure 2C:
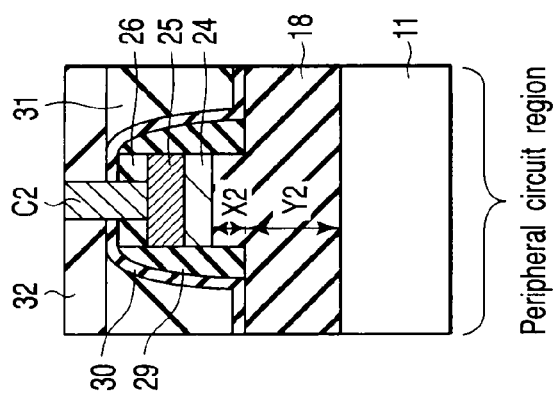
FIG. 2C is a sectional view showing the semiconductor memory device in the memory cell region taken along a line IIC-IIC in FIG. 1.

FIG. 1 is a sectional view showing a semiconductor memory device having a memory cell region and peripheral circuit region according to the first embodiment of the present invention. FIG. 2A is a sectional view showing the semiconductor memory device in the peripheral circuit region taken along a line IIA-IIA in FIG. 1. FIG. 2B is a sectional view showing the semiconductor memory device in the peripheral circuit region taken along a line IIB-IIB in FIG. 1. FIG. 2C is a sectional view showing the semiconductor memory device in the memory cell region taken along a line IIC-IIC in FIG.

Figure 2D:
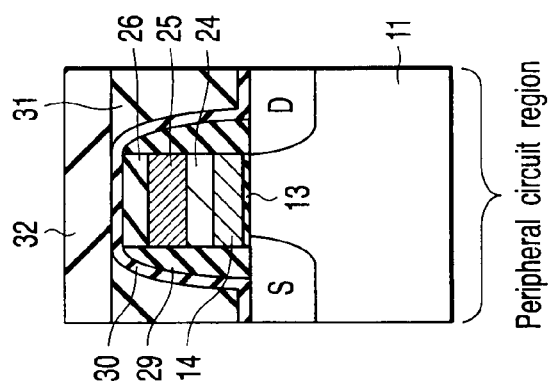
FIG. 2D is a sectional view showing the semiconductor memory device in the memory cell region taken along a line IID-IID in FIG. 1.

1. FIG. 2D is a sectional view showing the semiconductor memory device in the memory cell region taken along a line IID-IID in FIG. 1. The semiconductor memory device according to the first embodiment will be described below.

As shown in FIGS. 1 and 2A to 2D, the first embodiment is directed to a nonvolatile semiconductor memory having a memory cell region and peripheral circuit region. Examples of the nonvolatile semiconductor memory are a NAND flash memory and NOR flash memory.

In the memory cell region, a tunnel insulating film 12 is formed on a semiconductor substrate (silicon substrate) 11. A floating gate electrode FG is formed on the tunnel insulating film 12. An oxide nitride oxide (ONO) insulating film 21 is formed on the floating gate electrode FG. A control gate electrode CG is formed on the ONO insulating film 21. With this structure, a plurality of cell transistors Tr1 with a double gate structure are formed. The floating gate electrode FG includes a polysilicon layer 14. The control gate electrode CG includes two polysilicon layers 22 and 24. A WSi (tungsten silicide) film 25 is formed on the control gate electrode CG. A mask layer 26 is formed on the WSi film 25.

A plurality of element isolation insulating films STI1 with an STI structure are formed in the semiconductor substrate 11 in the memory cell region. The element isolation insulating film STI1 has a first portion STI1-A located under the control gate electrode CG and a second portion STI1-B located under a spacer 29. The element isolation insulating film STI1 at an end of each of the plurality of cell transistors Tr1 includes the first portion STI1-A and second portion STI1-B. The upper surface of the first portion STI1-A of the element isolation insulating film STI1 is higher than the upper surface of the semiconductor substrate 11 and is flush with, e.g., the upper surface of the tunnel insulating film 12. The upper surface of the second portion STI1-B of the element isolation insulating film STI1 is almost flush with the upper surface of the semiconductor substrate 11. The bottom surfaces of the first and second portions STI1-A and STI1-B of the element isolation insulating film STI1 have the same depth. The bottom surfaces are deeper than the upper surface of the semiconductor substrate 11 and also deeper than the bottom surface of the diffusion layer (not shown) of the cell transistor Tr1.

In the memory cell region, the floating gate electrode FG and tunnel insulating film 12 are self-aligned to the element isolation insulating film STI1. For this reason, the width of the floating gate electrode FG and tunnel insulating film 12 in the gate width direction equals the distance between the element isolation insulating films STI1.

In the peripheral circuit region, a gate insulating film 13 is formed on the semiconductor substrate 11. A gate wiring G is formed on the gate insulating film 13. Hence, a plurality of peripheral transistors Tr2 are formed. The gate wiring G includes the two polysilicon layers 14 and 24. The WSi film 25 is formed on the gate wiring G. The mask layer 26 is formed on the WSi film 25.

A plurality of element isolation insulating films STI2 with an STI structure are formed in the semiconductor substrate 11 in the peripheral circuit region. The element isolation insulating film STI2 has a first portion STI2-A located under part of the gate wiring G (polysilicon layer 24) and a second portion STI2-B located under the spacer 29. The upper surface of the first portion STI2-A of the element isolation insulating film STI2 is higher than the upper surface of the semiconductor substrate 11 and is flush with, e.g., the upper surface of the polysilicon layer 14. The upper surface of the second portion STI2-B of the element isolation insulating film STI2 is almost flush with the upper surface of the semiconductor substrate 11. The bottom surfaces of the first and second portions STI2-A and STI2-B of the element isolation insulating film STI2 have the same depth. The bottom surfaces are deeper than the upper surface of the semiconductor substrate 11 and also deeper than the bottom surface of the diffusion layer (not shown) of the peripheral transistor Tr2.

In the peripheral circuit region, the polysilicon layer 14 of the gate wiring G and the gate insulating film 13 are self-aligned to the element isolation insulating film STI2. For this reason, the width of the polysilicon layer 14 of the gate wiring G and the gate insulating film 13 in the gate width direction equals the distance between the element isolation insulating films STI2.

A barrier layer 30 is formed on the mask layer 26 in the memory cell region and peripheral circuit region. Insulating films 31 and 32 are formed on the barrier layer 30. Contacts C1 and C2 connected to the WSi film 25 through the insulating film 32, barrier layer 30, and mask layer 26 are formed. The contact C1 is located above the element isolation insulating film STI1. The contact C2 is located above the element isolation insulating film STI2.

In the above-described semiconductor memory device, a height h2 from the upper surface of the semiconductor substrate 11 to the upper surface of the mask layer 26 in the peripheral circuit region equals a height h1 from the upper surface of the semiconductor substrate 11 to the upper surface of the mask layer 26 in the memory cell region.

A height X2 (to be referred to as a height X2 of the element isolation insulating film STI2 hereinafter) from the upper surface of the semiconductor substrate 11 to the upper surface of the first portion STI2-A of the element isolation insulating film STI2 in the peripheral circuit region is larger than a height X1 (to be referred to as a height X1 of the element isolation insulating film STI1 hereinafter) from the upper surface of the semiconductor substrate 11 to the upper surface of the first portion STI1-A of the element isolation insulating film STI1 in the memory cell region.

The height X2 of the element isolation insulating film STI2 is preferably twice or more the height X1 of the element isolation insulating film STI1. The reason for this is as follows. The control gate electrode CG and semiconductor substrate 11 in the memory cell region are insulated by at least the tunnel insulating film 12 and ONO insulating film 21. To obtain a corresponding breakdown voltage by the high-breakdown voltage peripheral transistor Tr2, the height X2 of the element isolation insulating film STI2 must be equal to or more than (thickness of tunnel insulating film 12 +thickness of ONO insulating film 21).

The upper limit value of the height X2 of the element isolation insulating film STI2 is preferably equal to or smaller than the height of the polysilicon layer 14 of the gate wiring G. The reason for this is as follows. If the height X2 of the element isolation insulating film STI2 is larger than the height of the polysilicon layer 14, the height of the gate wiring G becomes larger on the element isolation insulating film STI2 than on the active region to generate a step difference. Hence, in CMP planarization of the buried insulating film 31, erosion (dishing) for the barrier layer 30 in the peripheral circuit region occurs.

The upper surface of the first portion STI1-A of the element isolation insulating film STI1 is preferably, e.g., lower than a level corresponding to the thickness of the floating gate electrode FG (polysilicon layer 14) and equal to or higher than the upper surface of the tunnel insulating film 12. The upper surface of the first portion STI2-A of the element isolation insulating film STI2 is preferably, e.g., higher than a level corresponding to about ½ the thickness of the polysilicon layer 14 and equal to or lower than the upper surface of the polysilicon layer 14.

A depth Y2 (to be referred to as a depth Y2 of the element isolation insulating film STI2 hereinafter) from the upper surface of the semiconductor substrate 11 to the bottom surface of the element isolation insulating film STI2 in the peripheral circuit region is larger than a depth Y1 (to be referred to as a depth Y1 of the element isolation insulating film STI1 hereinafter) from the upper surface of the semiconductor substrate 11 to the bottom surface of the element isolation insulating film STI1 in memory cell region.

The depth Y2 of the element isolation insulating film STI2 is preferably formed larger than the depth of a source/drain diffusion layer S/D of the high-breakdown-voltage peripheral transistor Tr2. The depth Y1 of the element isolation insulating film STI1 is preferably formed larger than the depth of the source/drain diffusion layer S/D of the cell transistor Tr1.

The depth of the source/drain diffusion layer SID of the peripheral transistor Tr2 is preferably formed larger than the depth Y1 of the element isolation insulating film STI1 and smaller than the depth Y2 of the element isolation insulating film STI2.

The depth of the source/drain diffusion layer S/D of the cell transistor Tr1 is preferably formed smaller than the depth Y1 of the element isolation insulating film STI1. For example, the depth of the source/drain diffusion layer S/D of the cell transistor Tr1 is preferably formed to be about ⅔ the depth Y1 of the element isolation insulating film STI1.

In the memory cell region and peripheral circuit region, the aspect ratio of the minimum space portion in the peripheral circuit region must be larger than the aspect ratio of the minimum space portion in the memory cell. For this reason, the ratio of the depth Y1 of the element isolation insulating film STI1 to the depth Y2 of the element isolation insulating film STI2 is preferably given by (depth Y1 +height of polysilicon layer 22 of control gate electrode CG)/(minimum width of element isolation insulating film STI1)>(depth Y2+height of polysilicon layer 14 of gate wiring G)/(minimum width of element isolation insulating film STI2)

A thickness Tm2 of the mask layer 26 in the peripheral circuit region is larger than a thickness Tm1 of the mask layer 26 in the memory cell region.

A thickness Ts2 of the WSi film 25 in the peripheral circuit region equals a thickness Ts1 of the WSi film 25 in the memory cell region.

A thickness Tg2 of the gate wiring G (polysilicon layers 14 and 24) in the peripheral circuit region is smaller than a thickness Tg1 of the gate wiring (floating gate electrode FG, ONO insulating film 21, and control gate electrode CG) in the memory cell region. A thickness Tg4 of the gate wiring (polysilicon layer 24) on the first portion STI2-A of the element isolation insulating film STI2 in the peripheral circuit region is smaller than a thickness Tg3 of the gate wiring (control gate electrode CG) on the first portion STI1-A of the element isolation insulating film STI1 in the memory cell region.

FIGS. 3 to 11C are sectional views showing steps in manufacturing the semiconductor memory device having the memory cell region and peripheral circuit region according to the first embodiment of the present invention. FIGS. 9A, 9B, and 9C and FIGS. 11A, 11B, and 11C show details of the manufacturing process, including sectional views (FIGS. 9B and 11B) of the peripheral circuit region shown in FIGS. 9A and 11A taken along a vertical direction and sectional views (FIGS. 9C and 11C) of the memory cell region shown in FIGS. 9A and 11A taken along a vertical direction. The method of manufacturing the semiconductor memory device according to the first embodiment will be described below.

Figure 3:
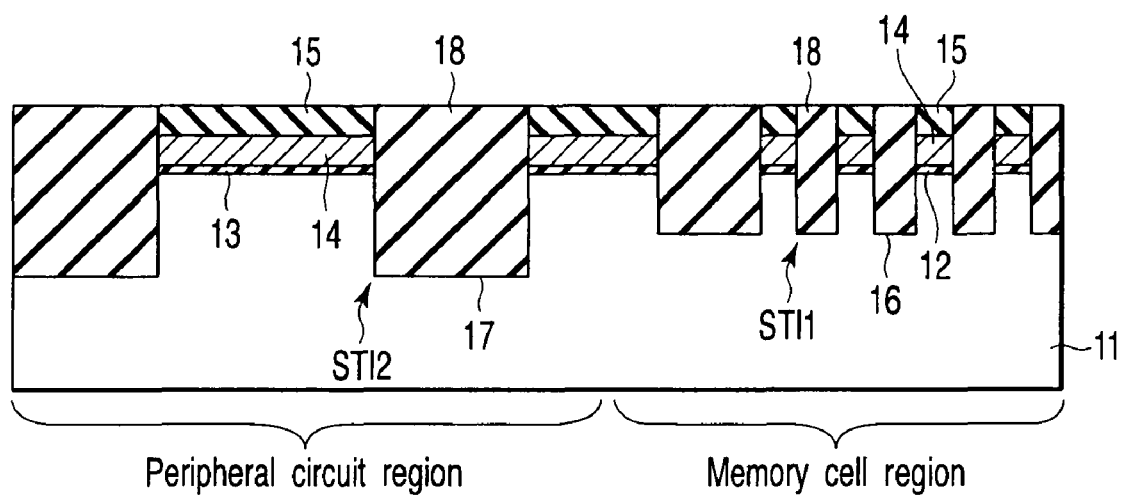
FIGS. 3, 4, 5, 6, 7, and 8 are sectional views showing steps in manufacturing the semiconductor memory device having the memory cell region and peripheral circuit region according to the first embodiment of the present invention.

First, as shown in FIG. 3, the tunnel insulating film 12 (e.g., $SiO_2$ film) is formed on the semiconductor substrate 11 in the memory cell region. After that, the gate insulating film (e.g., $SiO_2$ film) 13 is formed on the semiconductor substrate 11 in the peripheral circuit region. The gate insulating film 13 is preferably formed thicker than the tunnel insulating film 12. Either of the gate insulating film 13 and tunnel insulating film 12 can be formed first. The first polysilicon layer 14 serving as a gate wiring material is deposited. An SiN film 15 serving as a chemical mechanical polish (CMP) stopper material in STI gap filling is deposited on the first polysilicon layer 14. A trench 16 of the element isolation insulating film STI1 is formed in the memory cell region by reactive ion etching (RIE). A trench 17 of the element isolation insulating film STI2 is formed in the peripheral circuit region by RIE. The trench 17 in the peripheral circuit region is formed deeper than the trench 16 in the memory cell region. An oxide film 18 is buried in the trenches 16 and 17. The oxide film 18 is planarized by CMP. As a result, the element isolation insulating films STI1 and STI2 are formed in the memory cell region and peripheral circuit region, respectively.

Figure 4:
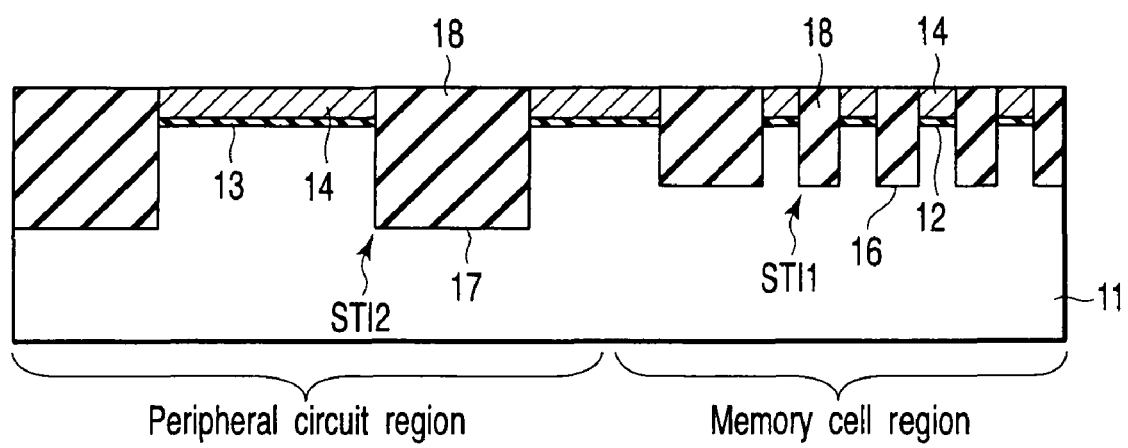

As shown in FIG. 4, the element isolation insulating films STI1 and STI2 are removed to a predetermined depth by wet etching by using the SiN film 15 as a mask. Then, the SiN film 15 is removed by hot phosphoric acid. The element isolation insulating films STI1 and STI2 may then be further removed to a predetermined depth by wet etching. As a result, the upper surfaces of the element isolation insulating films STI1 and STI2 become flush with, e.g., the upper surface of the first polysilicon layer 14.

Figure 5:
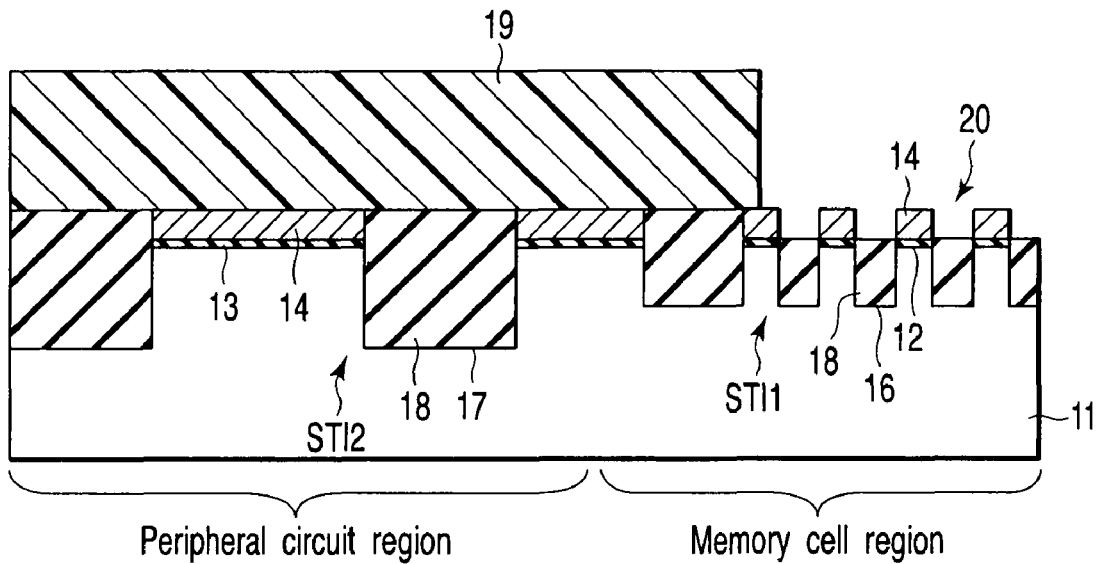

As shown in FIG. 5, a resist 19 is applied to the upper surfaces of the first polysilicon layer 14 and element isolation insulating films STI1 and STI2 and patterned to open the memory cell region. After that, the element isolation insulating film STI1 in the memory cell region is removed to a predetermined depth by dry etching. Consequently, the upper surface of the element isolation insulating film STI1 becomes lower than the upper surface of the first polysilicon layer 14 so that a trench 20 is formed. The upper surface of the element isolation insulating film STI1 is preferably lower than about ½ the thickness of the first polysilicon layer 14 and equal to or higher than the upper surface of the tunnel insulating film 12.

Figure 6:
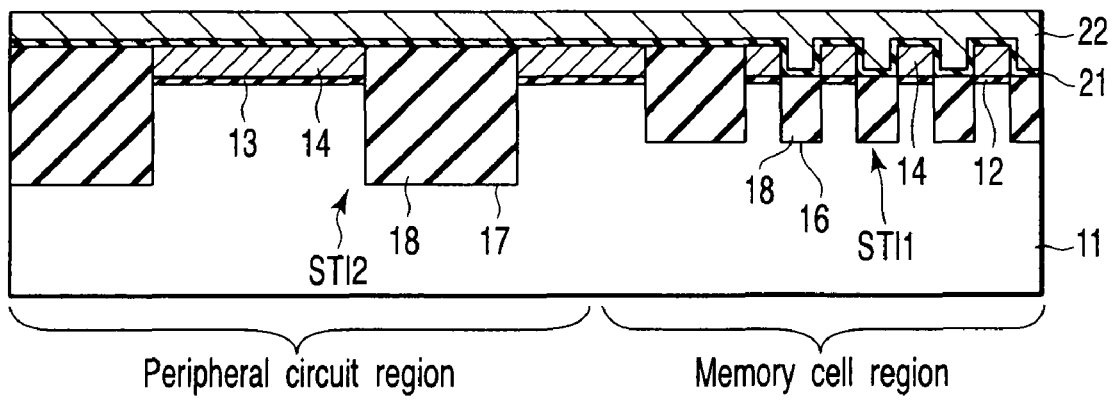

As shown in FIG. 6, the ONO insulating film 21 is deposited on the first polysilicon layer 14 and element isolation insulating films STI1 and STI2. The second polysilicon layer 22 is deposited on the ONO insulating film 21. The ONO insulating film 21 is formed from an $SiO_2$ film/SiN film/$SiO_2$ film.

Figure 7:
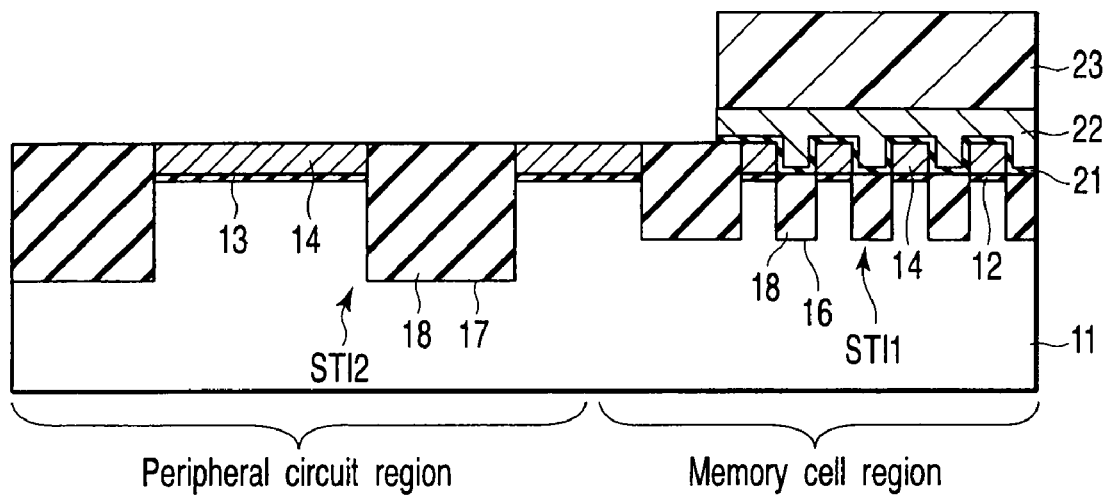

As shown in FIG. 7, a resist 23 is applied to the upper surface of the second polysilicon layer 22 and patterned to open the peripheral circuit region. The second polysilicon layer 22 and ONO insulating film 21 are etched by using the patterned resist 23. With this process, the first polysilicon layer 14 and element isolation insulating film STI2 in the peripheral circuit region are exposed. Then, the resist 23 is removed.

Figure 8:
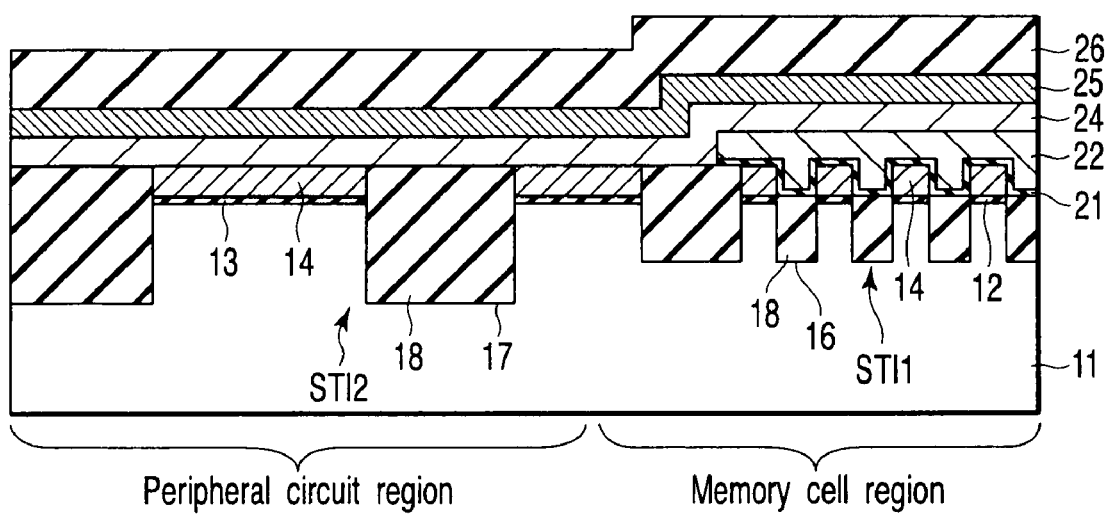

As shown in FIG. 8, the third polysilicon layer 24, WSi film 25, and mask layer 26 are deposited sequentially. The WSi film 25 need not always use W as a refractory metal. For example, Co or Ti may be used. As the mask layer 26, e.g., an $SiO_2$ film or SiN film is used.

Figures 9A, 9B, 9C:
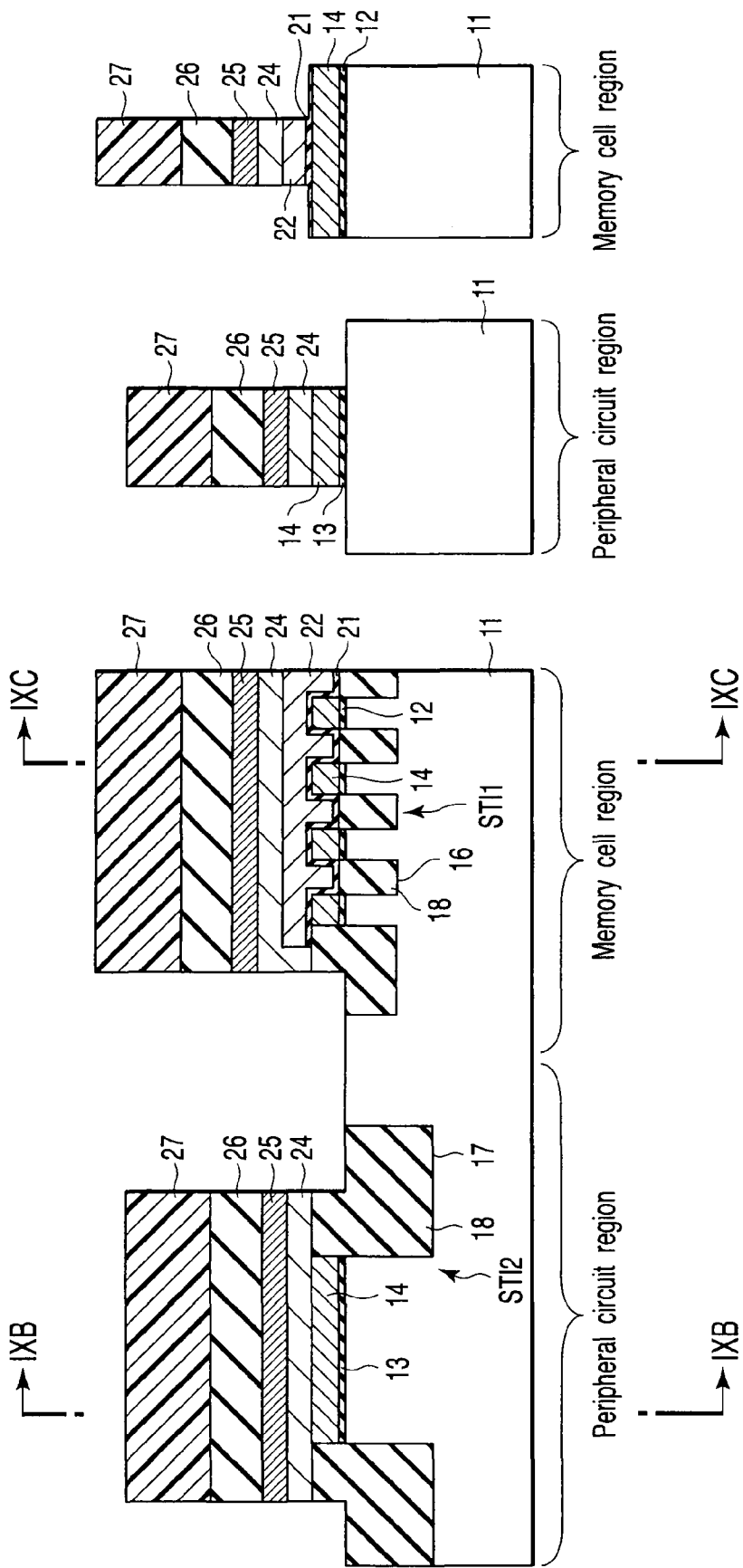
FIG. 9A is a sectional view showing steps in manufacturing the semiconductor memory device having the memory cell region and peripheral circuit region according to the first embodiment of the present invention following FIG. 8.
FIG. 9B is a sectional view showing the semiconductor memory device in the peripheral circuit region taken along a line IXB-IXB in FIG. 9A.
FIG. 9C is a sectional view showing the semiconductor memory device in the memory cell region taken along a line IXC-IXC in FIG. 9A.

As shown in FIGS. 9A to 9C, a resist 27 is applied to the upper surface of the mask layer 26 and processed into the gate wiring pattern. The mask layer 26, WSi film 25, third polysilicon layer 24, and second polysilicon layer 22 in the peripheral circuit region and memory cell region are etched by using the patterned resist 27. Then, etching is performed under a condition to decrease the selectivity of polysilicon to the oxide film and increase the selectivity to SiN. In the peripheral circuit region, the first polysilicon layer 14 and element isolation insulating film STI1 are etched so that the gate wirings are processed (FIG. 9B). In the memory cell region, etching is stopped on the upper surface of the SiN film of the ONO insulating film 21 (FIG. 9C). Then, the resist 27 is removed.

Figures 10A, 10B, 10C:
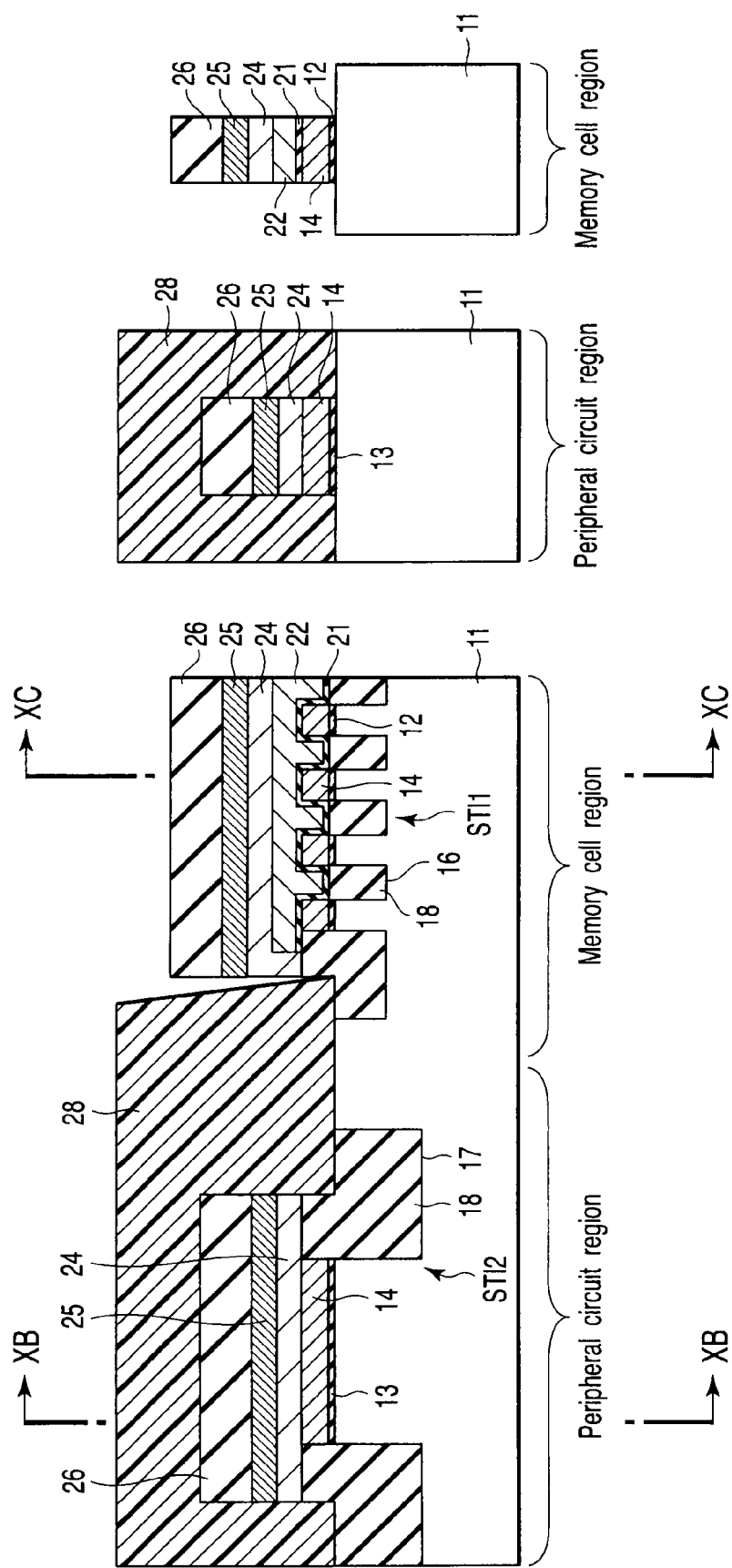
FIG. 10A is a sectional view showing steps in manufacturing the semiconductor memory device having the memory cell region and peripheral circuit region according to the first embodiment of the present invention following FIG. 9A.
FIG. 10B is a sectional view showing the semiconductor memory device in the peripheral circuit region taken along a line XB-XB in FIG. 10A.
FIG. 10C is a sectional view showing the semiconductor memory device in the memory cell region taken along a line XC-XC in FIG. 10A.
Figures 11A, 11B, 11C:
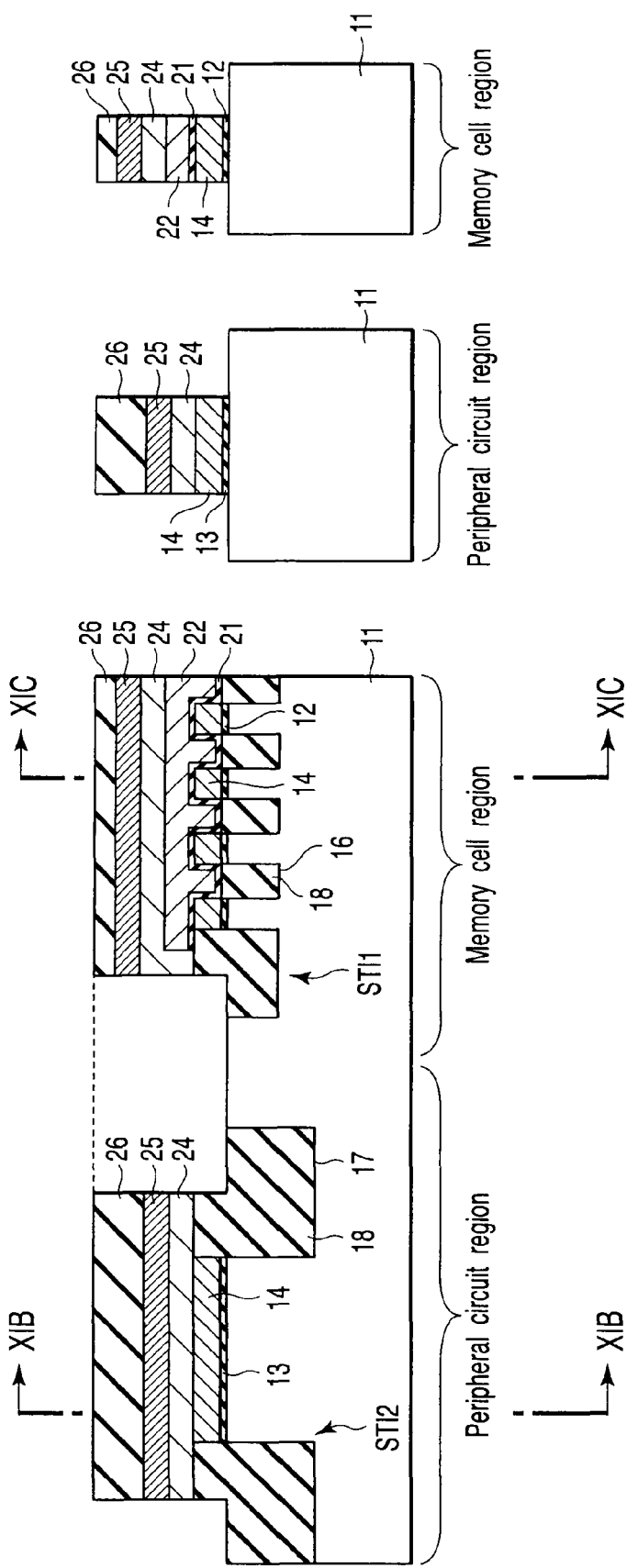
FIG. 11A is a sectional view showing steps in manufacturing the semiconductor memory device having the memory cell region and peripheral circuit region according to the first embodiment of the present invention following FIG. 10A.
FIG. 11B is a sectional view showing the semiconductor memory device in the peripheral circuit region taken along a line XIB-XIB in FIG. 11A.
FIG. 11C is a sectional view showing the semiconductor memory device in the memory cell region taken along a line XIC-XIC in FIG. 11A.

As shown in FIGS. 10A to 10C, a resist 28 is applied to the upper surface of the mask layer 26 and patterned to cover the peripheral circuit region. The SiN film and SiO$_2$ film of the ONO insulating film 21 and the first polysilicon layer 14 in the memory cell region are etched by dry etching. This dry etching is done under a condition to lower the mask layer 26 to a predetermined height. With this process, the upper surface of the mask layer 26 in the memory cell region becomes flush with that in the peripheral circuit region. Then, the resist 28 is removed.

Next, as shown in FIGS. 1 and 2A to 2D, ion implantation is executed to form diffusion layers necessary for forming a transistor. Then, the spacer 29 is formed on the side surface of the gate wiring. Heavily doped diffusion layers are formed. Next, the barrier layer 30 is deposited. The gate wiring is buried by the insulating film 31. The insulating film 31 is planarized by CMP. Subsequently, the insulating film 32 is formed on the insulating film 31 and barrier layer 30 and planarized. The contacts C1 and C2 extending through the insulating film 32, barrier layer 30, and mask layer 26 are formed. After a normal interconnection layer/passivation formation process is executed, the nonvolatile memory manufacturing process is ended.

According to the first embodiment, the thickness Tm2 of the mask layer 26 in the peripheral circuit region is larger than the thickness Tm1 of the mask layer 26 in the memory cell region. In addition, the thickness Tg2 of the gate wiring G (polysilicon layers 14 and 24) in the peripheral circuit region is smaller than the thickness Tg1 of the gate wiring (floating gate electrode FG, ONO insulating film 21, and control gate electrode CG) in the memory cell region. Hence, even when the element isolation insulating films STI1 and STI2 in the memory cell region and peripheral circuit region have the different heights X1 and X2 (X1<X2), the height h1 from the upper surface of the semiconductor substrate 11 to the upper surface of the mask layer 26 in the memory cell region can equal the height h2 from the upper surface of the semiconductor substrate 11 to the upper surface of the mask layer 26 in the peripheral circuit region. For this reason, any erosion (dishing) for the barrier layer 30 in the peripheral circuit region can be prevented in CMP planarization of the buried insulating film 31 of the gate wiring.

The element isolation insulating film STI2 in the peripheral circuit region has the large depth Y2 and large height X2. With this structure, the distance between the gate wiring and the bottom surface of the element isolation insulating film STI2 in the peripheral circuit region can be increased while avoiding any gap filling failure of the element isolation insulating film STI2 so that the element breakdown voltage can be increased. Furthermore, since the element isolation insulating film STI2 can be made narrow, the chip size can further be reduced.

The upper surfaces of the second portions STI1-B and STI2-B of the element isolation insulating films except under the gate wirings in the memory cell region and peripheral circuit region are lowered to the upper surface of the semiconductor substrate 11. With this structure, any etching residue can be prevented from being generated on the sides of the element isolation insulating films STI1 and STI2 in the gate process. Hence, any short circuit between the gate wirings can be prevented.

Second Embodiment

In the first embodiment, the height hi in the memory cell region is made equal to the height h2 in the peripheral circuit region by adjusting the difference (Tg1>Tg2) between the thicknesses Tg1 and Tg2 of the gate wirings by the thicknesses Tm1 and Tm2 (Tm1<Tm2) of the mask layers 26. In the second embodiment, a height h1 in the memory cell region is made equal to a height h2 in the peripheral circuit region by making thicknesses Tg1 and Tg2 of gate wirings equal to each other (Tg1=Tg2).

FIG. 12 is a sectional view showing a semiconductor memory device having a memory cell region and peripheral circuit region according to the second embodiment of the present invention. The semiconductor memory device according to the second embodiment will be described below. A description of the same structure as in the first embodiment will be omitted.

As shown in FIG. 12, the second embodiment is different from the first embodiment in that the height h1 from the upper surface of a semiconductor substrate 11 to the upper surface of a mask layer 26 in the memory cell region is made equal to the height h2 from the upper surface of the semiconductor substrate 11 to the upper surface of the mask layer 26 in the peripheral circuit region by making thickness Tg1 of a gate wiring (floating gate electrode FG, ONO insulating film 21, and control gate electrode CG) in the memory cell region equal to the thickness Tg2 of a gate wiring G (polysilicon layers 14, 41, and 24) in the peripheral circuit region.

For this reason, a thickness Tm2 of the mask layer 26 in the peripheral circuit region equals a thickness Tm1 of the mask layer 26 in the memory cell region. In addition, a thickness Ts2 of a WSi film 25 in the peripheral circuit region equals a thickness Ts1 of the WSi film 25 in the memory cell region.

The gate wiring G in the peripheral circuit region includes the three polysilicon layers 14, 41, and 24. The two polysilicon layers 41 and 24 extend onto a first portion STI2-A of an element isolation insulating film STI2. A thickness Tg4 of the gate wiring (polysilicon layers 41 and 24) on the element isolation insulating film STI2 in the peripheral circuit region is smaller than a thickness Tg3 of the gate wiring (control gate electrode CG) on an element isolation insulating film STI1 in the memory cell region.

FIGS. 13 to 17 are sectional views showing steps in manufacturing the semiconductor memory device having the memory cell region and peripheral circuit region according to the second embodiment of the present invention. FIGS. 15A, 15B, and 15C and FIGS. 16A, 16B, and 16C show details of the manufacturing process, including sectional views (FIGS. 15B and 16B) of the peripheral circuit region shown in FIGS. 15A and 16A taken along a vertical direction and sectional views (FIGS. 15C and 16C) of the memory cell region shown in FIGS. 15A and 16A taken along a vertical direction. The method of manufacturing the semiconductor memory device according to the second embodiment will be described below.

First, the processes shown in FIGS. 3 to 7 of the above-described first embodiment are done. A second polysilicon layer 22 and ONO insulating film 21 in the peripheral circuit region are removed so that the first polysilicon layer 14 and element isolation insulating film STI2 in the peripheral circuit region are exposed.

Figure 13:
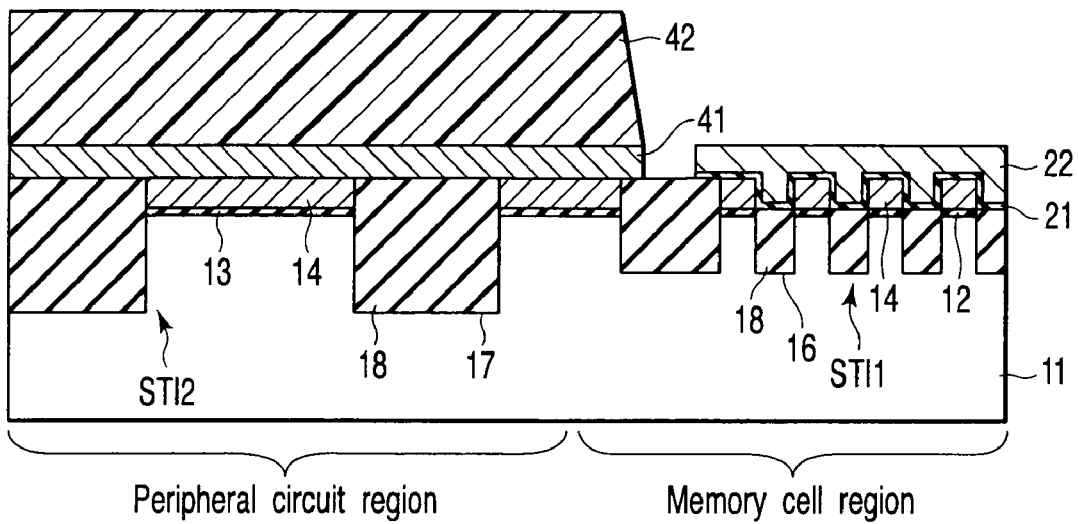
FIGS. 13 and 14 are sectional views showing steps in manufacturing the semiconductor memory device having the memory cell region and peripheral circuit region according to the second embodiment of the present invention.

As shown in FIG. 13, the third polysilicon layer 41 is deposited. A resist 42 is applied to the upper surface of the third polysilicon layer 41 and patterned to open the memory cell region. The third polysilicon layer 41 is etched and left only in the peripheral circuit region by using the patterned resist 42. Then, the resist 24 is removed.

In depositing the third polysilicon layer 41, a native oxide film (not shown) is formed on the polysilicon layer 22 in the memory cell region. The native oxide film is used as a stopper in etching the third polysilicon layer 41.

In the process shown in FIG. 13, the upper surface of the third polysilicon layer 41 is preferably flush with the upper surface of the second polysilicon layer 22. For this purpose, the third polysilicon layer 41 is deposited to the same thickness as that of the second polysilicon layer 22. When the second and third polysilicon layers 22 and 41 are deposited to different thicknesses, a process of making the upper surfaces of the second and third polysilicon layers 22 and 41 equal may be added.

Figure 14:
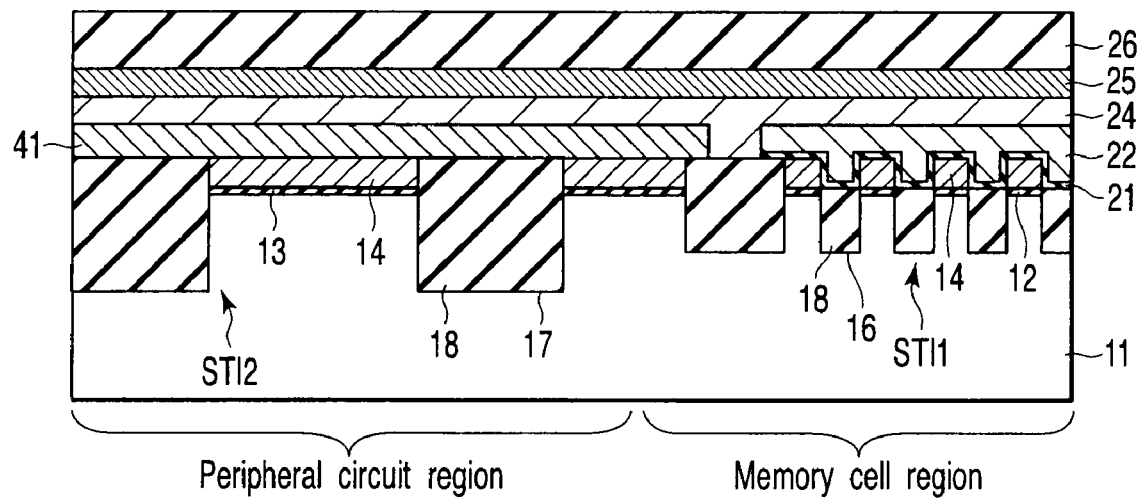

As shown in FIG. 14, the fourth polysilicon layer 24, WSi film 25, and mask layer 26 are deposited sequentially on the second and third polysilicon layers 22 and 41. The WSi film 25 need not always use W as a refractory metal. For example, Co or Ti may be used. As the mask layer 26, e.g., an $SiO_2$ film or SiN film is used.

Figures 15A, 15B, 15C:
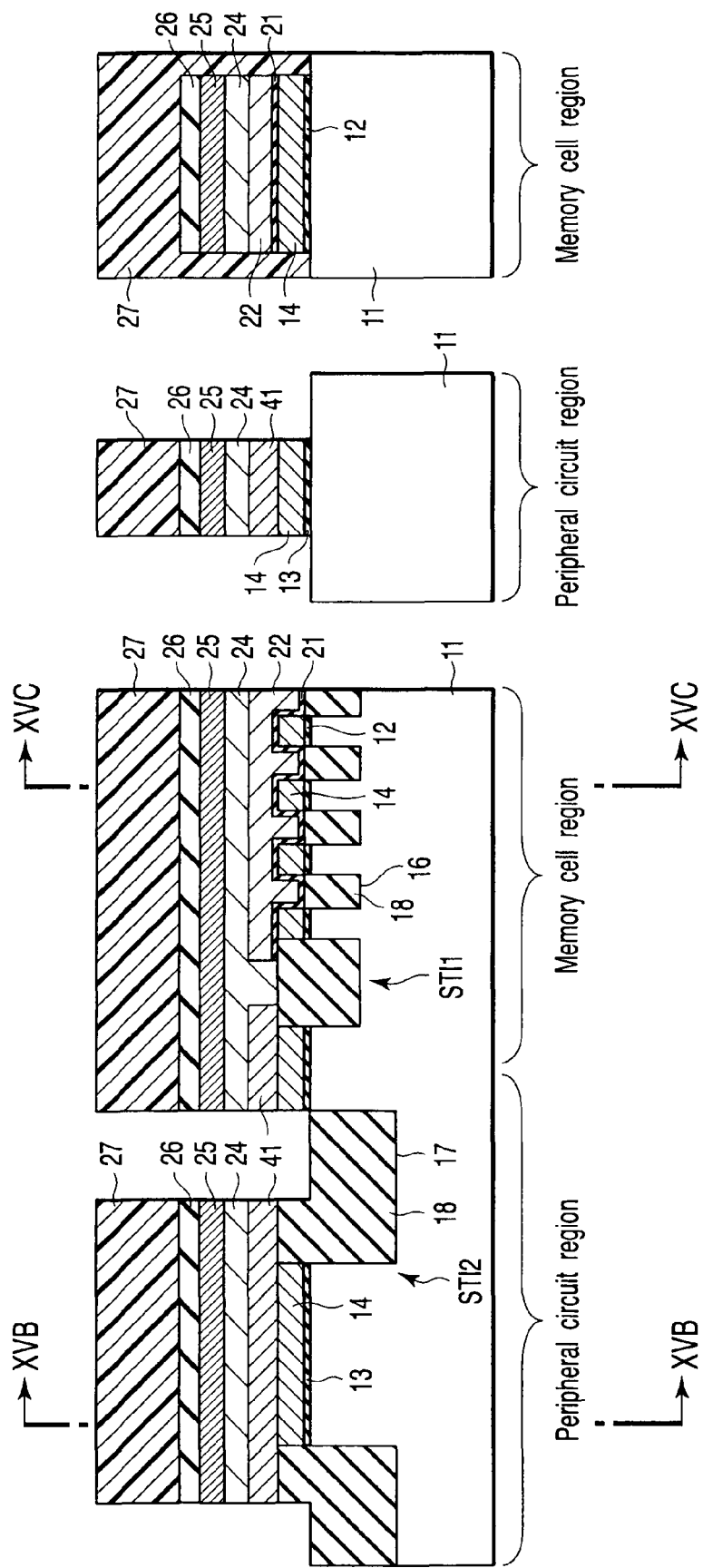
FIG. 15A is a sectional view showing steps in manufacturing the semiconductor memory device having the memory cell region and peripheral circuit region according to the second embodiment of the present invention following FIG. 14.
FIG. 15B is a sectional view showing the semiconductor memory device in the peripheral circuit region taken along a line XVB-XVB in FIG. 15A.
FIG. 15C is a sectional view showing the semiconductor memory device in the memory cell region taken along a line XVC-XVC in FIG. 15A.

As shown in FIGS. 15A to 15C, a resist 27 is applied to the upper surface of the mask layer 26 and processed into the gate wiring pattern. The mask layer 26, WSi film 25, fourth polysilicon layer 24, third polysilicon layer 41, and first polysilicon layer 14 in the peripheral circuit region are etched by using the patterned resist 27. With this process, the gate wiring in the peripheral circuit region is processed. Then, the resist 27 is removed.

Figures 16A, 16B, 16C:
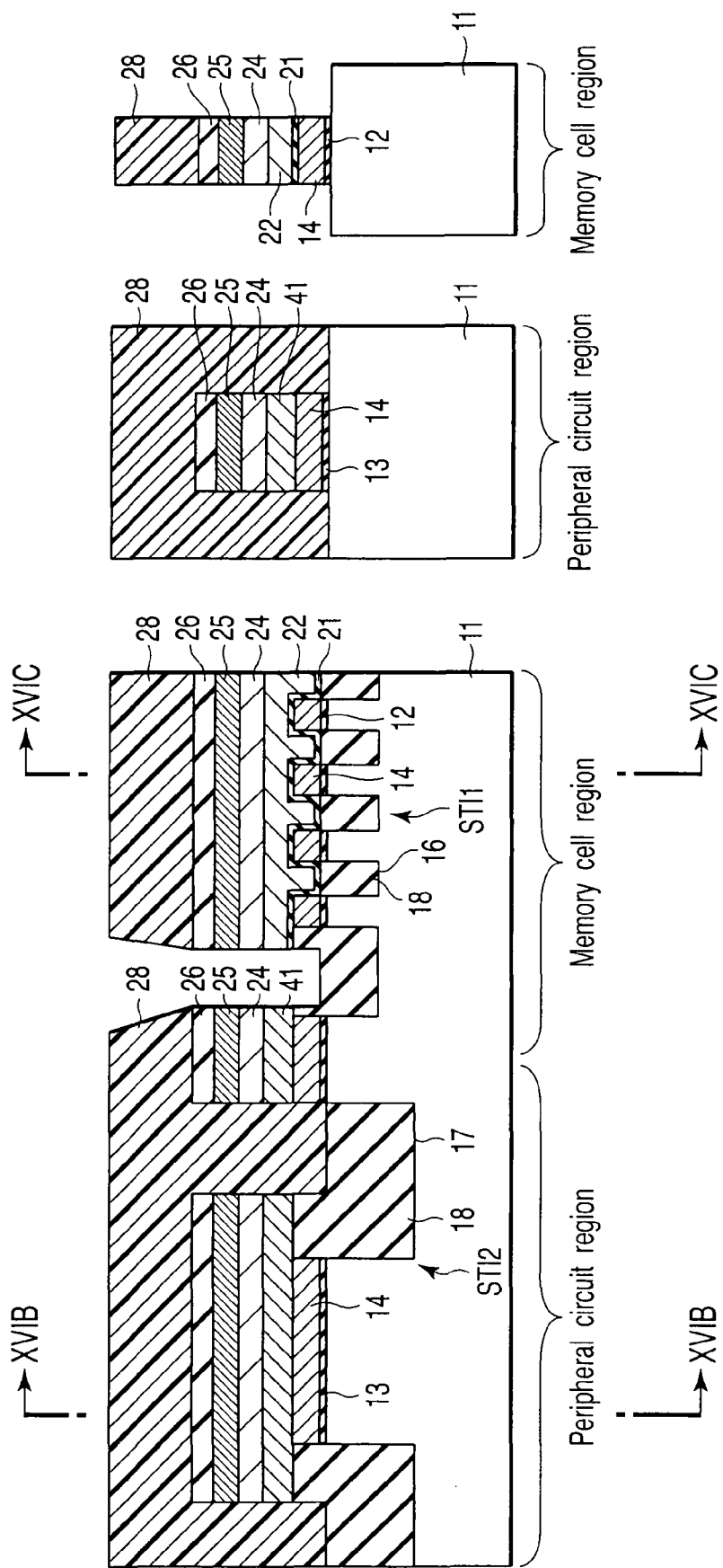
FIG. 16A is a sectional view showing steps in manufacturing the semiconductor memory device having the memory cell region and peripheral circuit region according to the second embodiment of the present invention following FIG. 15A.
FIG. 16B is a sectional view showing the semiconductor memory device in the peripheral circuit region taken along a line XVIB-XVIB in FIG. 16A.
FIG. 16C is a sectional view showing the semiconductor memory device in the memory cell region taken along a line XVIC-XVIC in FIG. 16A.

As shown in FIGS. 16A to 16C, a resist 28 is applied to the upper surface of the mask layer 26 and processed into the gate wiring pattern.

The mask layer 26, WSi film 25, fourth polysilicon layer 24, and second polysilicon layer 22 in the memory cell region are etched by using the patterned resist 28. With this process, the gate wiring in the memory cell region is processed.

Figure 17:
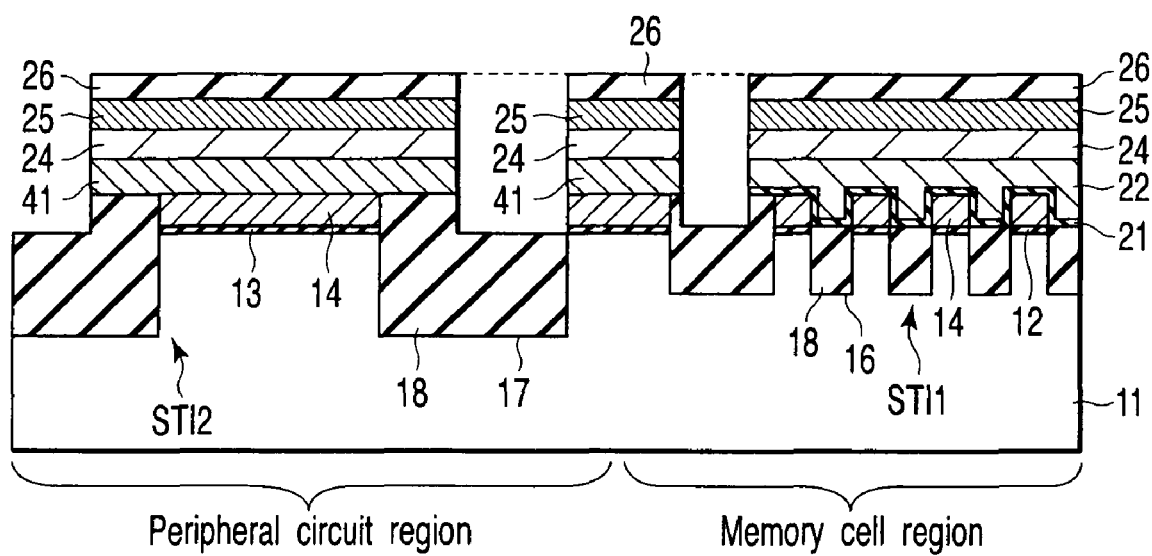
FIG. 17 is a sectional view showing steps in manufacturing the semiconductor memory device having the memory cell region and peripheral circuit region according to the second embodiment of the present invention following FIG. 16A.

As shown in FIG. 17, the resist 28 is removed. In this way, the gate wirings can be formed while making the height of the mask layer 26 in the memory cell region equal to that in the peripheral circuit region.

Next, as shown in FIG. 12, ion implantation is executed to form diffusion layers necessary for forming a transistor. Then, a spacer 29 is formed on the side surface of the gate wiring. Heavily doped diffusion layers are formed. Next, a barrier layer 30 is deposited. The gate wiring is buried by an insulating film 31. The insulating film 31 is planarized by CMP. Subsequently, an insulating film 32 is formed on the insulating film 31 and barrier layer 30 and planarized. Contacts C1 and C2 extending through the insulating film 32, barrier layer 30, and mask layer 26 are formed. After a normal interconnection layer/passivation formation process is executed, the nonvolatile memory manufacturing process is ended.

According to the second embodiment, the same effect as in the first embodiment can be obtained. Additionally, in the second embodiment, since the thicknesses Tm1 and Tm2 of the mask layers 26 in the memory cell region and peripheral circuit region are equal, the contacts C1 and C2 can more easily be formed than in the first embodiment.

The present invention is not limited to the above-described embodiments, and various changes and modifications can be made in practicing it. For example, the element isolation insulating films STI1 and STI2 need not always be self-aligned to the gate wirings and can be formed independently of the gate wirings. The embodiments of the present invention need not always be applied when the gate wirings in the memory cell region and peripheral circuit region have a level difference and can also be applied even when the gate wirings have a level difference between various regions (e.g., between the memory cell regions, between the peripheral circuit regions, between the memory cell region and a logic circuit region, or between the peripheral circuit region and a logic circuit region).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device manufacturing method comprising:

in a semiconductor substrate having a first region and a second region, forming a first gate insulating film on the semiconductor substrate in the first region and forming a second gate insulating film on the semiconductor substrate in the second region;

forming a first gate wiring material on the first gate insulating film and the second gate insulating film;

forming a first element isolation insulating film by partially removing the first gate wiring material, the first gate insulating film, and the semiconductor substrate and forming a second element isolation insulating film by partially removing the first gate wiring material, the second gate insulating film, and the semiconductor substrate;

making a first height from an upper surface of the semiconductor substrate to an upper surface of the first element isolation insulating film smaller than a second height from the upper surface of the semiconductor substrate to an upper surface of the second element isolation insulating film by removing an upper portion of the first element isolation insulating film;

forming a second gate wiring material in the first region;

forming a third gate wiring material on the second gate wiring material, the first gate wiring material in the second region and the second element isolation insulating film;

forming a mask layer on the third gate wiring material to make an upper surface of the mask layer in the first region higher than an upper surface of the mask layer in the second region; and removing an upper portion of the mask layer in the first region to make a film thickness of the mask layer in the first region thinner than a film thickness of the mask layer in the second region to make a height from the upper surface of the semiconductor substrate to the upper surface of the mask layer in the first region equal to a height from the upper surface of the semiconductor substrate to the upper surface of the mask layer in the second region.

2. The method according to claim 1, wherein a second depth from the upper surface of the semiconductor substrate to a bottom surface of the second element isolation insulating film is larger than a first depth from the upper surface of the semiconductor substrate to a bottom surface of the first element isolation insulating film.

3. The method according to claim 1, wherein in processing the first gate wiring material, the second gate wiring material, and the third gate wiring material in the first region, the upper portion of the first mask layer is removed.

4. The method according to claim 1, further comprising forming a first contact above the first element isolation insulating film and forming a second contact above the second element isolation insulating film.

5. The method according to claim 1, wherein
the first region is a memory cell region, and the second region is a peripheral circuit region, and
in the memory cell region, the first gate wiring material functions as a floating gate electrode, the second gate wiring material and the third gate wiring material function as a control gate electrode, and an insulating film is provided between the floating gate electrode and the control gate electrode.

6. A semiconductor memory device manufacturing method comprising:
in a semiconductor substrate having a first region and a second region, forming a first gate insulating film on the semiconductor substrate in the first region and forming a second gate insulating film on the semiconductor substrate in the second region;
forming a first gate wiring material on the first gate insulating film and the second gate insulating film;
forming a first element isolation insulating film by partially removing the first gate wiring material, the first gate insulating film, and the semiconductor substrate and forming a second element isolation insulating film by partially removing the first gate wiring material, the second gate insulating film, and the semiconductor substrate;
making a first height from an upper surface of the semiconductor substrate to an upper surface of the first element isolation insulating film smaller than a second height from the upper surface of the semiconductor substrate to an upper surface of the second element isolation insulating film by removing an upper portion of the first element isolation insulating film;
forming a second gate wiring material in the first region, forming a third gate wiring material in the second region, and making upper surfaces of the second gate wiring material and the third gate wiring material flush with each other; and
forming a first mask layer on the second gate wiring material and forming a second mask layer on the third gate wiring material;
forming a first gate wiring formed from the first gate wiring material and the second gate wiring material by patterning the first mask layer, the first gate wiring material, the second gate wiring material, the first gate insulating film and the first element isolation insulating film; and
forming a second gate wiring formed from the first gate wiring material and the third gate wiring material by patterning the second mask layer, the first gate wiring material, the third gate wiring material, the second gate insulating film and the second element isolation insulating film,
wherein the first element isolation insulating film has a first portion and a second portion,
the second element isolation insulating film has a third portion and a fourth portion,
the first portion has a first upper surface higher than the upper surface of the semiconductor substrate and a first bottom surface lower than the upper surface of the semiconductor substrate, and is located in a lower part the first gate wiring,
the second portion has a third upper surface equal to the upper surface of the semiconductor substrate in height and a third bottom surface equal to the first bottom surface in depth, and is located except for the lower part the first gate wiring,
the third portion has a second upper surface higher than the upper surface of the semiconductor substrate and a second bottom surface lower than the upper surface of the semiconductor substrate, and is located in a lower part the second gate wiring, and
the fourth portion has a fourth upper surface equal to the upper surface of the semiconductor substrate in height and a fourth bottom surface equal to the second bottom surface in depth, and is located except for the lower part the second gate wiring.

7. The method according to claim 6, wherein a thickness of the second mask layer equals a thickness of the first mask layer.

8. The method according to claim 6, wherein
the first region is a memory cell region, and the second region is a peripheral circuit region, and
in the memory cell region, the first gate wiring material functions as a floating gate electrode, the second gate wiring material functions as a control gate electrode, and an insulating film is provided between the floating gate electrode and the control gate electrode.

* * * * *